(12) United States Patent
Lee et al.

(10) Patent No.: US 6,366,874 B1
(45) Date of Patent: Apr. 2, 2002

(54) SYSTEM AND METHOD FOR BROWSING GRAPHICALLY AN ELECTRONIC DESIGN BASED ON A HARDWARE DESCRIPTION LANGUAGE SPECIFICATION

(75) Inventors: Chia Huei Lee; Jensen Tsai, both of San Jose, CA (US); Meng-Hui Chen, Chutung Town; Banghwa Ho, Hsinchu, both of (TW); Yen-Son Huang, Saratoga; Changson Teng, San Jose, both of CA (US)

(73) Assignees: Novas Software, Inc., San Jose, CA (US); Springsoft, Inc., Hsinchu (TW)

( * ) Notice: Subject to any disclaimer, the term of this patent is extended or adjusted under 35 U.S.C. 154(b) by 0 days.

(21) Appl. No.: 09/317,691

(22) Filed: May 24, 1999

(51) Int. Cl.[7] ........................... G06F 17/50; G06F 9/455
(52) U.S. Cl. ................................ 703/14; 716/18; 716/3
(58) Field of Search .......................... 703/14; 706/919, 706/920, 921; 345/964; 716/1, 2, 3, 11, 18

(56) References Cited

U.S. PATENT DOCUMENTS

| | | | | |
|---|---|---|---|---|
| 5,592,392 A | * | 1/1997 | Matheson et al. ............. 716/11 |
| 5,801,958 A | | 9/1998 | Dangelo et al. |
| 5,826,020 A | * | 10/1998 | Randell ....................... 709/202 |
| 5,892,678 A | * | 4/1999 | Tokunoh et al. ................ 716/2 |
| 5,983,277 A | * | 11/1999 | Heile et al. .................. 709/232 |
| 6,014,506 A | * | 1/2000 | Hossain et al. ................ 716/11 |
| 6,216,252 B1 | * | 4/2001 | Dangelo et al. ................. 716/1 |
| 6,226,777 B1 | * | 5/2001 | Zhang ......................... 716/18 |
| 6,226,780 B1 | * | 5/2001 | Bahra et al. .................. 716/18 |

OTHER PUBLICATIONS

Mayer et al., "A Graphical Data Management System for HDL–Based ASIC Design Projects", Proc. Euro–DAC '96, pp. 92–97, Sep. 1996.*

Harmanani et al., "Syntest: An Environment for System Level Design Test", Euro–DAC '92, pp. 402–407, Sep. 1992.*

Wan et al., "VHdbx: An X Window System Based High–Level Debugger for the VHDL Simulation Environment", Proc. 4th International Conference on Solid–State and Integrated Circuit Technology, pp. 358–360, Oct. 1995.*

* cited by examiner

Primary Examiner—Russell W. Frejd
(74) Attorney, Agent, or Firm—Smith-Hill and Bedell

(57) ABSTRACT

Hardware description language (HDL)-centered design system and methodology uses HDL specification effectively as master depository for design intent or knowledge. Through network browser, designers conveniently navigate or explore design graphically. Designers selectively review or save design in entirety or portions. Design capture, analysis, and manipulation are based on HDL specification, either directly through text file editing, or indirectly through use of graphical tools.

8 Claims, 3 Drawing Sheets

SYSTEM AND METHOD FOR BROWSING GRAPHICALLY AN ELECTRONIC DESIGN BASED ON A HARDWARE DESCRIPTION LANGUAGE SPECIFICATION

FIELD OF INVENTION

Invention relates generally to computer-aided design ("CAD") of electronic circuits, and more particularly to graphical visualization and exploration of electronic circuit designs specified in hardware description language ("HDL").

BACKGROUND OF INVENTION

Conventional electronic circuit design tools and methodology employ textual and/or graphical entry means to capture design intent, specify circuit behavior, and communicate design intent and behavior, particularly between original circuit designer and other technical personnel, such as design reader, potential user, or other design team members. CAD environments typically provide software-automated entry means to enable communications between designer and computer-implemented tool, i.e., to capture, analyze, or manipulate design data.

Various graphical representation methods are used to facilitate human visualization and communication, such as: logic symbols, block diagrams, process flowcharts, finite state machine transition diagrams, circuit/logic schematics, timing waveform diagrams, etc. Such graphical representations serve as standard methods to illustrate circuit/logic design textbooks, manufacturer data sheets, and engineering design documents.

Although conventional graphical representations serve to illustrate certain design aspects, thereby effectively improving human communication, such graphical representations are, nonetheless, imprecise and informal, and often limited for communicating critical design information. Moreover, prior to widespread use of computer graphics workstations, which have advanced display outputs and input devices, such graphical representations were employed primarily for manual human visualization purposes, i.e., without convenient means to enter design data into computers. In such prior techniques, man-machine communication relied largely on textual specification (e.g., manually-edited netlist files and Boolean logic equations), which were, nonetheless, generally more precise than purely manual techniques.

More recently, as more powerful computational and graphics processing, and software design tools are developed, operational interaction between designer and computer increasingly is accomplished using graphics-based representations. Hence, more sophisticated CAD applications, such as graphical schematic editors, state machine designers, and graphical simulation waveform viewers, are more widely adopted.

Additionally, several related trends are emerging in CAD tool development and AD-centered design methodology. One important trend is general acceptance of simulation as requisite to conventional design verification. As design complexity continues to increase substantially, however, simulation techniques have also improved significantly, evolving to higher abstraction levels, e.g., from relatively simple transistor circuit-level simulation to logic gate-level simulation to register transfer language (RTL)-level simulation.

Furthermore, as recent system chip designs approach or exceed multi-million-gate counts, even relatively more abstract design definitions at the RTL-level may be difficult for designers and tools to manage, particularly since such large designs may be unacceptably detailed and too unwieldy for practical simulation runs. Accordingly, one increasingly popular approach for handling such complex designs is behavioral-level modeling and simulation, which allows designers to define system functionality at an even higher level of behavioral abstraction.

Unfortunately, with conventional design verification or simulation methodologies, textual specification (i.e., languaged-based definition) of prototype circuit under development is commonly employed. Textual specification of circuit design at structural or gate-level is often referred to as a "net list." At behavioral-level, textual specification is often defined through source code written in one or more Hardware Description Languages (HDL), which is written similarly to conventional software program instructions.

Another conventional trend in electronic design automation (EDA) is the adoption of logic synthesis to generate detailed logic to implement algorithms or finctions. Instead of manually crafting logic circuits to perform functions, a specification of the intended function is described in HDL format (e.g., behaviorally or at RTL level), then supplied to a special software-automated design tools, such as "logic synthesizer" or "design compiler," which automatically generate detailed logic gates for implementing desired function.

As a consequence of such synthesized or compiled design methodology, certain familiar structural diagrams, such as gate-level schematics, are no longer generated for designer review, debugging, or documentation. Both design-related files (i.e., input, which is behavioral or RTL-level specification; and output, which is structural, gate-level net list, from the logic synthesizer) are text-based. Hence, designers no longer "draw" schematics, with or without CAD-tool assistance. Accordingly, the design may contain no schematic diagrams.

Yet another conventional trend in EDA is the increased use of hardware description languages for specifying designs, as well as related standardization of HDL formats (e.g., Verilog HDL, and VHSIC HDL (VHDL). Such HDL formats enable design specification at varying abstraction levels (e.g., behavioral, RTL, structural, gate, etc.) Along with increased simulation and synthesis, HDL formats have become common way to specify designs. More importantly, the design database is often maintained textually in one or more HDL files.

Because human designers generally communicate more effectively through graphical interfaces rather than textual specifications, there is increased need to employ graphical CAD tools increasingly to facilitate certain areas of design creation and analysis.

SUMMARY OF INVENTION

Invention resides in system and/or method for graphically browsing and exploring an electronic design, which is specified according to hardware description or similar language, such as verilog HDL or VHDL. Such system or method is implemented using computer-implemented software application which enables designer dynamically to review various design facets. Design methodology uses HDL-based design specification (i.e., "golden" or master repository file), which may be created by text editing, or generated, at least in part, interactively or automatically, using one or more automated graphical design tools.

Preferably, user dynamically selects design entirely or partially for graphical presentation. Selected presentations are referred to herein as "views," such that each view is generated dynamically and may involve one or more instances of user-selected design objects, (e.g., components, pins, circuits, logic blocks, interconnects, signal nets, buses, annotating notes, etc.). During browsing of selected views, user may edit design objects or other functional or non-functional aspects thereof, preferably in connectivity-driven manner (i.e., editing is graphically sensitive to associated design connections.) In this interactive manner, presentation views of design are effectively more intuitive and illustrate design data to convey design intent more understandably, particularly for use in design documentation or other user communication.

Optionally, user saves one or more extracted views of design data in graphical design database. Saved views are retrievable for subsequent edit or transfer to other tools, such as for design documentation. Design may include modular or partitioned functional blocks, wherein each block may comprise one or more hierarchical partition levels. Modules or blocks correspond to functionality at specified design abstraction levels, e.g., behavioral, RTL, structural, gate-level, etc.. Further, modules may correspond to multiple coexisting functional abstractions.

Additionally, browsing of design may be accomplished distributedly through local, wide, or other network (e.g., Internet World Wide Web), such that, when extracting views, the viewing workstation may be distinct from the workstation storing the design database. Multiple views may be presented on networked workstations, simultaneously or at different times.

Design modifications to HDL specification file are applied in controlled manner by direct text edits (e.g., create new HDL source code, or modify existing HDL code), or indirect graphical entry (i.e., thereby updating HDL specification.) In such controlled manner, modification entries may automatically accomplish one or more engineering change orders (ECO), whereby specified design operations (e.g., additions, subtractions, modifications, etc.) are applied to saved views to reflect design changes.

DETAILED DESCRIPTION OF PREFERRED EMBODIMENT

Figure 1:
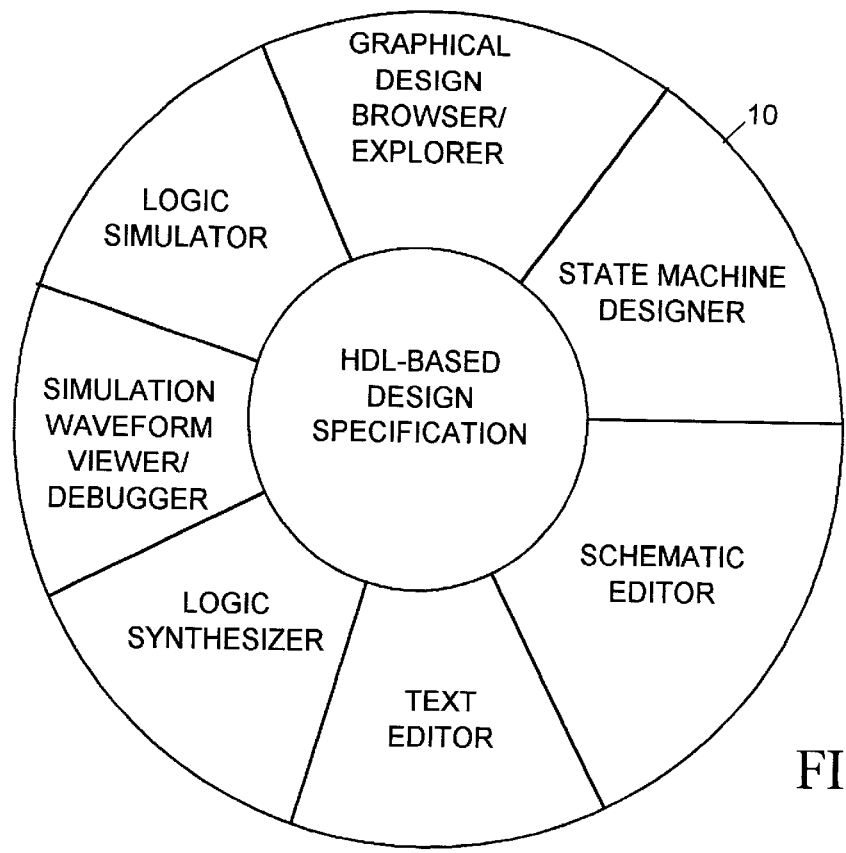
FIG. 1 diagram shows graphical design browser of present invention in HDL-based design environment.

Preferred embodiment is a system and/or related method for enabling, among other things, selective browsing and editing of hardware description language (HDL)-based design. One or more computer-automated engineering or design software tools are described herein for graphically exploring one or more specified electronic designs.

Generally, when operating or executing on a computer or engineering workstation, present automated design tool or functionally equivalent program initially processes or compiles HDL or other fictionally equivalent specification of electronic circuit design or system (e.g., Verilog or VHDL-format or similar files), and automatically generates therefrom graphical database, which may include various design data, such as component instances, component pins, routing wires connecting such pins to symbolize signal nets, buses, design information, etc.

Additionally, user/designer may use such design tool dynamically to select or indicate, and graphically present or display at least one design portion or subset for browsing or review. Such selected portion may contain one or more design aspects, such as component instances, component pins, and signal nets, wherein pins or wires connecting pins are designated to be in floating condition. As understood generally herein, such graphical presentation of selected design portion is referred to broadly as a design "view."

Further, to enable multiple view processing, user/designer may use design tool dynamically to select or indicate, and graphically present or display at least one other design portion or subset for browsing or review. Such other selected portion may contain one or more design aspects, such as component instances, component pins, and signal nets, wherein pins or wires connecting pins are designated to be in floating condition.

Multiple views may be presented by design tool to users or engineering workstations simultaneously or at different times. Multiple views may display subset of selected design aspects, such as component instances, component pins, and signal nets that are in common or associated therewith. Also, design aspects, such as component instance or component pin or signal net common between multiple views, may be presented differently (e.g., selectable display attributes or other graphical characteristics.)

Preferably, view presentation is user-customizable or otherwise software-optimizable, e.g., automatically generated and based on design aspects, such as component instances, component pins, or signal nets selected; or manually through interactive user editing. Computer-assisted editing operations maintain and use connectivity data in design specification.

During interactive operation of design tool, user may selectively save one or more full or partial view in graphical database, as well as restore previously saved view for examination or edit. Additionally, views may be exported or otherwise transferred by design tool as representative electronic files to other applications, such as a documentation tool to create design documents.

Also, design tool may generate one or views that span, represent or otherwise display multiple levels of design hierarchy, i.e., in case of hierarchically-partitioned designs. Relatively lower-level details of hierarchical module are interactively expandable by design tool during user viewing. Furthermore, different instances of certain module, in the same or different views, are presentable by design tool at different hierarchical levels. Additionally, design tool may generate views containing mixed design modules from different design abstraction levels, and different instances of certain module, in the same or different views, are presentable at different design abstraction levels.

Preferably, design tool enables users to browse or otherwise access remotely through a network a design on a workstation, which is distinct from the workstation where the design database for design is maintained. Hence, functional connectivity may be provided between workstations through local, wide or Internet network infrastructure, and browsing or other data access operation is accomplished through a browser or functionally equivalent software. Multiple views may be browsed or accessed through the network simultaneously or at different times.

Optionally, design tool automatically or regularly updates or modifies one or more saved views after an engineering change order (ECO) or other design view modification that alters one or more portions of the design, e.g., through design specification changes. ECO updates effectively preserve user design intent or other desired functionality as captured or otherwise shown or specified in a view by user selection of certain design aspects, such as component instances, pins, signal nets, etc., for inclusion in one or more views by design tool.

Preferably, design tool provides software-automated optimization or organization to present design information graphically according to one or more optimization rules or assumptions in view to improve understandability or interactive editing of view or design functionality, e.g., for user design definition, analysis, verification, or documentation.

FIG. 1 shows possible software design tool or system organization 10 for HDL-based design environment, including one or more electronic automated design tools, such as graphical design browser or explorer tool, state machine designer or analysis tool, schematic editor or capture tool, text editor or documentation tool, logic or behavioral synthesizer or definition tool, simulation waveform viewer/debugger or verification tool, logic simulator or testing tool, etc. As shown, one or more HDL-based or functionally equivalent design specification may couple centrally to various design tools provided to the design system or tool suite.

Preferably, central to the design environment is HDL specification of system, circuit or prototype design under development. In this arrangement, various CAD tools, textual and/or graphical, which couple electronically or have database access to the HDL specification, serve to capture, define, analyze, test, simulate, manipulate, or otherwise automatically or manually process portions or all of circuit being designed.

Text-based tools, such as text editor, may cooperate directly with the HDL specification, e.g., by reading and/or writing design data or modifications thereto and/or therefrom. But, graphical tools, such as schematic editor, may include or have separate access to one or more sub-environments, graphical databases, or design information file other than the main HDL specification.

Hence, graphical tool, such as a state machine designer tool, may focus design analysis on certain circuit portion, for example, thereby addressing selected state machine subportion of circuit design. In this isolated approach, graphical tool operates effectively in stand-alone mode and may generate therefor HDL code portion for incorporation in the design specification.

Generally, according to present improved design system and methodology, HDL design specification is defined, generated, stored or otherwise maintained in digital memory, repository or other electronic storage as master source code, database or "golden" file database to specify one or more prototype circuit, system or other intended design and/or graphical data under development or otherwise saved previously.

Graphical design browser and/or explorer tool couples to HDL specification to enable user graphical exploration of circuit under development. User may selectively choose one or more design object or module instances and/or signal nets on each module for examination.

Design browser and/or explorer tool may generate one or more graphical representation or design view dynamically from HDL specification, preferably showing one or more level of design detail selected by user. Design browser and/or explorer tool may shows user-selectively in design view, floating pins, net routing or other related interconnect or wiring design data. Moreover, using design browser and/or explorer tool interactively during design editing or other modification, user may determine or customize locations of selected pins and arrangement of routing wires for optimized or more understandable view.

Figure 2A:
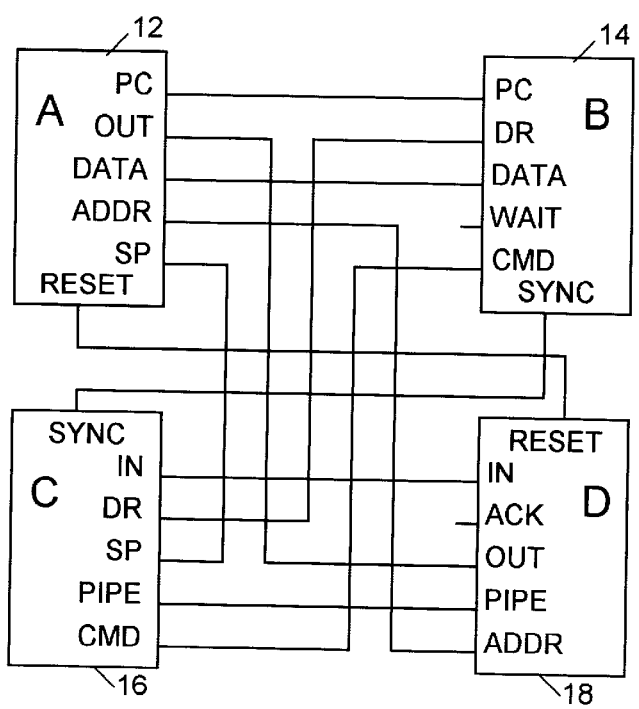
FIG. 2A shows example of whole-circuit view.
Figure 2B:
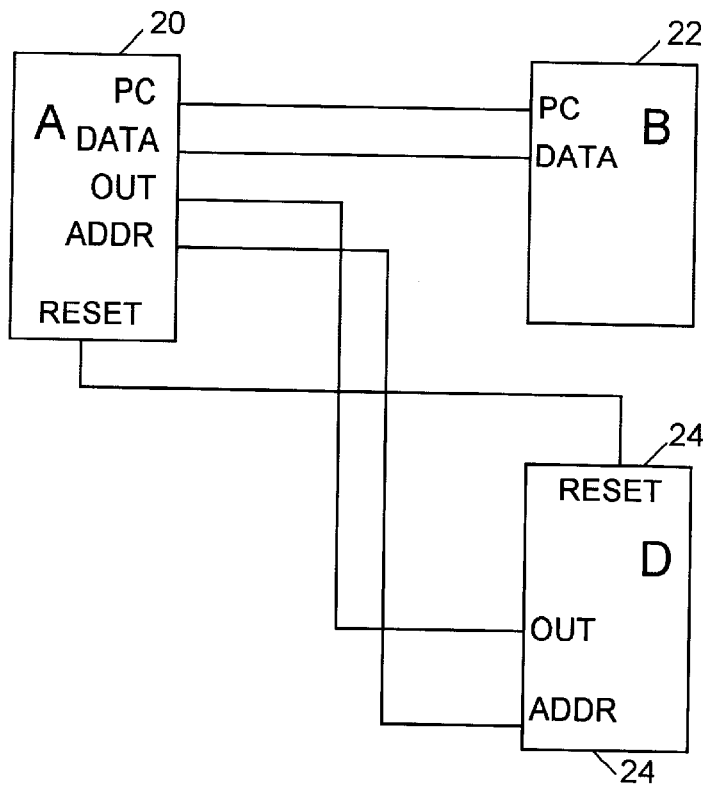
FIG. 2B shows example of partial design view.

Views may show entire circuit at top level in design hierarchy, i.e., with design object, interconnect or other informational details of functional sub-modules suppressed or otherwise shown in other lower-level views, or circuit portions of design at other hierarchy levels. For example, whole-circuit view (i.e., with blocks 12, 14, 16, 18) is illustrated in FIG. 2A; and partial view of design (i.e., with blocks 20, 22, 24) is shown in FIG. 2B.

During design-view examination, users can perform various editing operations. For example, users can alter graphic symbols for component instances to improve graphical illustration or functional understandability thereof Design browser and/or explorer tool automatically may determine schematic or physical arrangement or placement of component or other design objects or instances. User of such design tool can adjust component placement, pin locations, or signal wire routing to enhance readability or design function understandability.

Figure 3A:
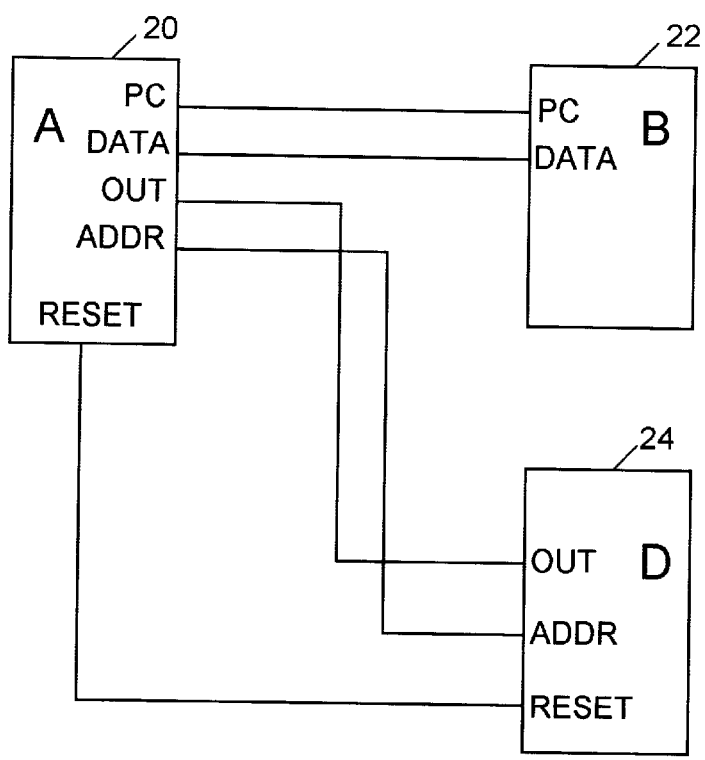
FIG. 3A shows example view prior to edit.
Figure 3B:
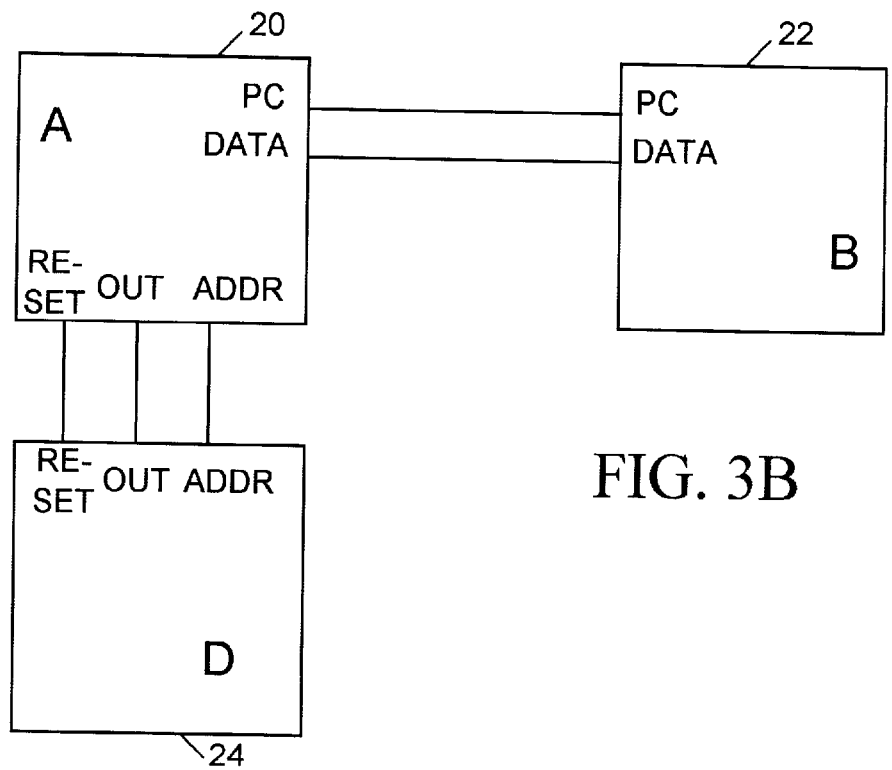
FIG. 3B shows example view after edit.

During editing operation, design browser and/or explorer tool maintains full knowledge or equivalent database of design connectivity information. For example, component pins that are electrically common may be shown by such design tool as connected by graphically connecting "wires," with interactive display features, such as rubber-banding and highlighting of selected design objects or interconnect. Hence, as illustration of sample design view having interconnected blocks 20, 22, 24, FIG. 3A shows view before editing step, and FIG. 3B shows view after editing step.

Preferably, design browser and/or explorer tool operates selectively to present design entities or related objects that are pertinent or otherwise user-selected for current design task, suppressing unnecessary or other unselected objects and design details. View selection allows designer to look at design from particular angle, relative sizing, or other graphical perspective. Selected view may be used to communicate or present design intent, functionality, operation, architecture, or other related knowledge to other members of design team or potential user, or included in design documentation. Extracted whole- or partial-circuit view may be saved by design tool into graphical design database for subsequent retrieval, modification, and examination.

Figure 4:
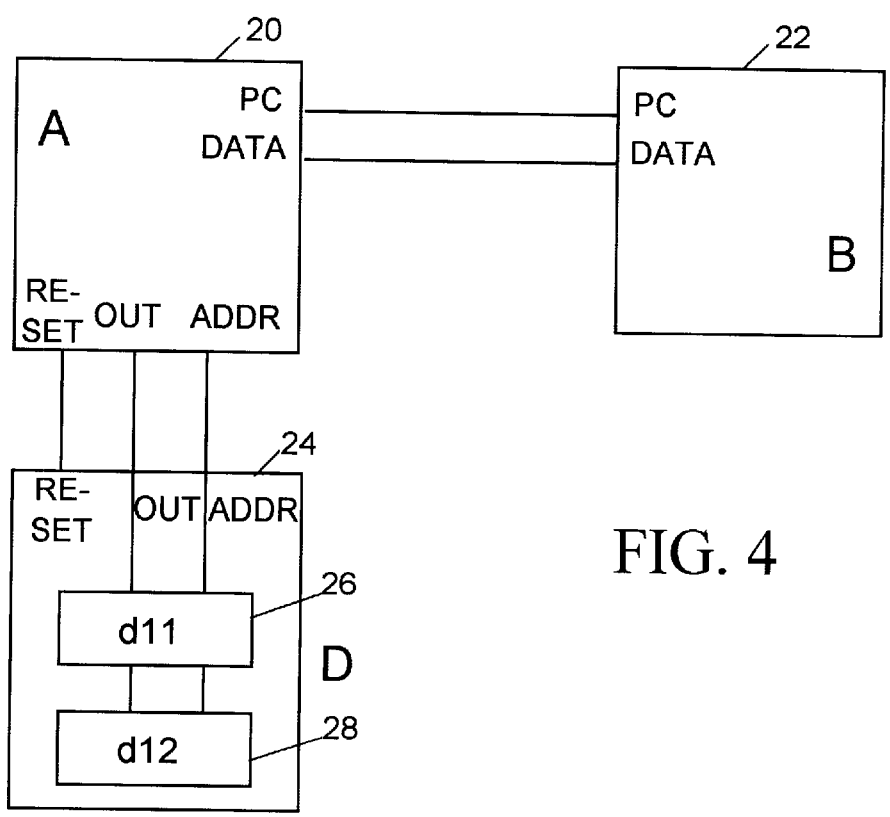
FIG. 4 shows example hierarchical view.

Design browser and/or explorer tool enables user to view design data hierarchically or in other functionally modular manner. For example, according to interactive user selection or command, functional block containing one or more levels of hierarchical or modular partitioning are shown in one or more design views by such design tool, effectively in situ, with next-level modules and any design connectivity provided among such modules to any relative hierarchical level. FIG. 4 shows example design having blocks 20, 22, 24, where block 24 includes in situ hierarchical view of lower-level blocks 26, 28.

During circuit development using design browser and/or explorer or other design tool, circuit portions are designed or specified in varying degrees of completion. For example, one circuit module may be skeletal or outline in initial form with only interface signal pins identified, and no internal circuit details provided. Another module may be defined according to behavioral functionality, without describing circuit implementation. And another module may be specified fully at gate level, for example, as generated automatically by output file from logic synthesizer or state machine design tool. Preferably, design browser and/or explorer design tool presents user with interactive ability to display one or more views of current design through mixture of functional modules at different levels of abstraction.

Optionally, design browser and/or explorer design tool provides distributed or networked interconnection between system design tools, databases, and one or more engineering workstations to allow one or more designers using the preferred design tool suite to browse or otherwise access one or more design files through digital networks.

For example, Internet- or World Wide Web-browser or other functionally equivalent software application, such as Netscape Navigator or Microsoft Internet Explorer program, may be provided and configured in a networked processing environment, such that a browsing workstation is distinct or otherwise functionally separable from another workstation where the HDL design database is maintained.

Hence, network connectivity between design suite workstations may span or otherwise access beyond Local Area Network (LAN) to Wide Area Network or other nodes coupled thereto. In networked configuration, design browser and/or explorer design tool allows designs to be browsed remotely by various users, as well as enable multiple views from common or different designs to be presented by such design tool on various workstations using network connections, either simultaneously or at different times.

During circuit or prototype development, it is contemplated herein that preferred design tool suite enables ongoing additions, subtractions, and other changes to be made to the design specification and database. For example, behavioral code may be developed for circuit modules initially, other modules may be created textually or schematically at structural level, and other modules may be created using state machine design tool.

Additionally, during circuit or prototype development, whole or partial circuit or functional modules may be verified through simulation tools. Depending on simulation data, circuit portions may be modified, for example, by adding or changing HDL source code directly, or by using graphical tool such as schematic editor. Such design process iterates toward successively more complete design specification.

Preferably, upon completing one or more design modification, such as addition, subtraction, or other functional or associated database change, an engineering change order (ECO) is processed therefor, and the HDL source code specification is updated correspondingly to reflect each design modification. Design browser and/or explorer design tool or other design tool in preferred tool suite may provide capability, for example, through batch command, to propagate some or all effected changes to saved graphical views. Thus, design views effectively are synchronized regularly to be current with HDL-based master specification.

Foregoing described embodiments of the invention are provided as illustrations and descriptions. They are not intended to limit the invention to precise form described. In particular, Applicants contemplate that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

What is claimed is:

1. For an integrated circuit (IC) design system providing tools enabling a user to create and modify a hardware description language (HDL) specification describing an IC as a multiple-level hierarchy of interconnected IC components, wherein some IC components residing at some levels of the hierarchy are formed by IC components residing at lower levels of the hierarchy, a computer-implemented method for providing the user with a graphical view of the IC described by the HDL specification, the method comprising the steps of:
   a. processing the HDL specification to generate a graphical database describing the IC as a hierarchical network of interconnected graphical objects, wherein each graphical object represents a separate one of the IC components;
   b. processing the graphical database to generate and display a user-selected block diagram view of a user-selected portion of the IC including graphical objects representing IC components linked by representations of signal paths between those IC components; and
   c. automatically reprocessing the HDL specification to update the graphical database when the user uses one of the tools to modify the HDL specification to make the graphical database description of the IC consistent with the modified HDL specification.

2. The method in accordance with claim 1 further comprising the step of:
   d. automatically reprocessing the graphical database to update the display of the user-selected block diagram view when the graphical database is updated at step c to make the display consistent with the updated graphical database.

3. The method in accordance with claim 1 wherein the user-selected block diagram view of the IC includes graphical objects depicting IC components residing at more than one level of the hierarchy.

4. The method in accordance with claim 1 wherein step b comprises the substeps of:
   b1. processing the graphical database to produce a display of a first block diagram view of the IC comprising first graphic objects representing first IC components residing at a first level of the hierarchy,
   b2. receiving input from the user indicating a subset of the first graphic objects that are to be included in a second block diagram view of the IC, and
   b3. displaying the second block diagram view of the IC including the user-selected subset of the first graphic objects and excluding all others of the first graphic objects.

5. The method in accordance with claim 4 wherein step b further comprises the substeps of:
   b4. receiving input from the user selecting at least one of the first graphic objects included in the second block diagram view; and
   b5. processing the graphical database to generate the display of the user-selected view of the IC including the subset of first graphic objects included in the second view and including second graphic objects representing second IC components residing at a second level of the hierarchy forming the at least one of the first graphic objects included in the second block diagram view.

6. The method in accordance with claim 1 further comprising the steps of:
   d. responding to first input from the user by saving a description of the user-selected view in the graphical database, e. responding to second input from the user by terminating the display of the user-selected view, and f. responding to third input from the user by retrieving and processing the saved description of the user-selected view to regenerate the display of the user-selected view.

7. The method in accordance with claim 2 further comprising the steps of:

e. responding to first input from the user by saving a description of the user-selected view in the graphical database, f. responding to second input from the user by terminating the display of the user-selected view, and g. responding to third input from the user by retrieving and processing the saved description of the user-selected view to regenerate the display of the user-selected view.

8. The method in accordance with claim 4 further comprising the steps of:

d. responding to first input from the user by saving a description of the user-selected view in the graphical database, e. responding to second input from the user by terminating the display of the user-selected view, and f. responding to third input from the user by regenerating the display of the user-selected view in accordance with the description of the user-selected view saved in the graphical database.

\* \* \* \* \*